(12) United States Patent  (10) Patent No.: US 7,687,990 B2
Winters et al.  (45) Date of Patent: Mar. 30, 2010

(54) OLED DEVICE WITH SHORT REDUCTION

(75) Inventors: Dustin L. Winters, Webster, NY (US); Yuan-Sheng Tyan, Webster, NY (US); Ansuman Banerjee, Cincinnati, OH (US); Thomas R. Cushman, Rochester, NY (US); Steven A. Van Slyke, Pittsford, NY (US)

(73) Assignee: Global OLED Technology LLC, Wilmington, DE (US)

( * ) Notice: Subject to any disclaimer, the term of this patent is extended or adjusted under 35 U.S.C. 154(b) by 350 days.

(21) Appl. No.: 11/734,485

(22) Filed: Apr. 12, 2007

(65) Prior Publication Data

US 2008/0252208 A1 Oct. 16, 2008

(51) Int. Cl.
*H01J 1/62* (2006.01)
(52) U.S. Cl. ............ 313/506; 313/504; 445/24
(58) Field of Classification Search ......... 313/498–512; 445/24
See application file for complete search history.

(56) References Cited

U.S. PATENT DOCUMENTS

| 4,356,429 | A | 10/1982 | Tant |
| 5,550,066 | A | 8/1996 | Tang et al. |
| 6,127,004 | A | 10/2000 | Hatwar et al. |
| 6,208,075 | B1 | 3/2001 | Hung et al. |
| 6,208,077 | B1 | 3/2001 | Hung |
| 6,720,573 | B2 | 4/2004 | Son et al. |
| 7,122,254 | B2 | 10/2006 | Beierlein et al. |
| 7,183,707 | B2 | 2/2007 | Tyan et al. |
| 2005/0084799 | A1 | 4/2005 | Yahagi et al. |
| 2005/0225234 | A1* | 10/2005 | Tyan et al. .................. 313/504 |

FOREIGN PATENT DOCUMENTS

| EP | 07882987 | 1/1997 |
| EP | 1745922 | 4/2005 |
| JP | 1995094282 | 4/1995 |
| JP | 2002100483 | 4/2002 |

* cited by examiner

*Primary Examiner*—Bumsuk Won
(74) *Attorney, Agent, or Firm*—Morgan Lewis & Bockius LLP

(57) ABSTRACT

In an OLED device having a substrate, a first electrode layer disposed over the substrate, an inorganic short reduction layer disposed over the first electrode layer, an organic electroluminescent medium disposed over the short reduction layer, and a second electrode layer over the electroluminescent medium, a feature is the inclusion of a mixture of ZnS, $SiO_2$, and ITO in the short reduction layer wherein the ratio of In atoms to Zn atoms is in the range of from 0.90 to 2.37.

7 Claims, 1 Drawing Sheet

US 7,687,990 B2

OLED DEVICE WITH SHORT REDUCTION

FIELD OF THE INVENTION

The present invention relates to short reduction in OLED devices and displays.

BACKGROUND OF THE INVENTION

In the simplest form, an organic electroluminescent (EL) device is comprised of an organic electroluminescent media disposed between first and second electrodes serving as an anode for hole injection and a cathode for electron injection. The organic electroluminescent media supports recombination of holes and electrons that yields emission of light. These devices are also commonly referred to as organic light-emitting diodes, or OLEDs. A basic organic EL element is described in U.S. Pat. No. 4,356,429. In order to construct a pixelated OLED display device that is useful as a display such as, for example, a television, computer monitor, cell phone display, or digital camera display, individual organic EL elements can be arranged as pixels in a matrix pattern. These pixels can all be made to emit the same color, thereby producing a monochromatic display, or they can be made to produce multiple colors such as a three-pixel red, green, blue (RGB) display. OLED display devices have also been fabricated with active matrix (AM) driving circuitry in order to produce high performance displays. An example of such an AM OLED display device is disclosed in U.S. Pat. No. 5,550,066.

When manufacturing organic EL displays, problems such a particle contamination or scratches in the organic EL materials can result in defects in a display. One type of defect that is caused by particle contamination or scratches is a short circuit through the thin organic materials, connecting the anode and the cathode. A short between the anode and cathode results in a non-emitting pixel (dead pixel) or a pixel that emits at reduced brightness (dim pixel).

A structure for improving robustness against shorting defects is described by Tyan et al. in U.S. Pat. No. 7,183,707. Tyan et al. describe inclusion of an inorganic short reduction layer disposed between the organic electroluminescent media and one of the electrodes. The short reduction layer has a particular electrical resistivity and thickness to reduce leakage current through a shoring defect. Several useful materials are described including Molybdium oxides as well as mixtures of partially conducting metal oxides with insulating oxides, fluorides, and sulfides.

SUMMARY OF THE INVENTION

A new short reduction layer material has been discovered experimentally by the present inventors, which can be easily made with the appropriate electrical resistance properties to improve robustness to shorts in an OLED device.

In accordance with the present there is provided an OLED device having:

(a) a substrate;

(b) a first electrode layer disposed over the substrate;

(c) an inorganic short reduction layer disposed over the first electrode layer;

(d) an organic electroluminescent medium disposed over the short reduction layer; and (e) a second electrode layer over the electroluminescent medium, the improvement comprising:

(f) the short reduction layer including a mixture of ZnS, $SiO_2$, and ITO wherein the ratio of In atoms to Zn atoms is in the range of from 0.90 to 2.37.

Figure 1:
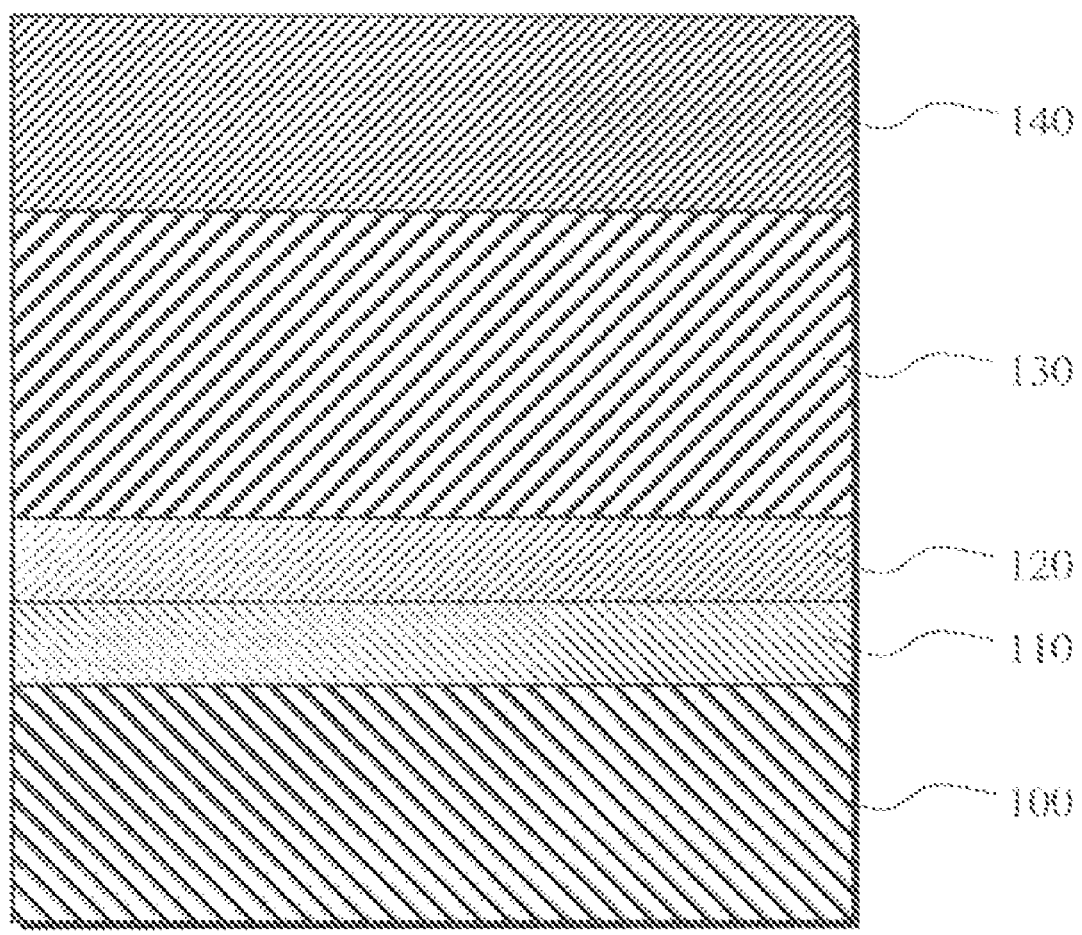
FIG. 1 is cross-sectional illustration of an OLED device having a short reduction layer according to the present invention.

Since device feature dimensions such as layer thicknesses are frequently in sub-micrometer ranges, the drawings are scaled for ease of visualization rather than dimensional accuracy.

DETAILED DESCRIPTION OF THE INVENTION

An OLED device having a short reduction layer according to the present invention is shown in FIG. 1. The device is fabricated over a substrate 100. Advantageous substrates include substrates made of glass such as Corning 1737 type glass. Other substrates are known for use with OLED devices including metal foils (such as stainless steel foils), silicon wafers, and plastic substrates. Such substrate materials can also be used in the present invention by one skilled in the art. Over substrate 100, a lower electrode 110 is formed. The lower electrode 110 can be formed of Indium Tin Oxide (ITO) or other transparent conductive oxides such as Indium Zinc Oxide (IZO), Aluminum doped Zinc Oxide (AZO), or the like. Such transparent lower electrode materials when used in combination with a transparent substrate 100 such as glass allow for light emission from the OLED device to be viewed through the substrate. This configuration is known as a bottom emission configuration. Alternate configurations where the light emission is viewed from the opposition direction (referred to as a top emission configuration) or in both directions (referred to as a dual emission configuration) are also known in the art and can be applied to the present invention. The lower electrode is commonly configured as the anode of the organic light emitting diode but arrangements where the lower electrode is alternately configured as the cathode of the organic light emitting diode are known in the art. Examples described in the present invention will use the more configuration where the lower electrode is configured as the anode.

A short reduction layer 120 is formed over the lower electrode 110. In accordance with the present invention, the short reduction layer is a mixture of Indium Tin Oxide (ITO) and Zinc Sulfide (ZnS) Silicon Dioxide (SiO2) (this mixture hereafter referred to as ZSO). These materials may be formed by co-sputtering from a first ITO sputter target and a second ZSO sputtering target. Alternately, the various component materials may be mixed into single, compound sputter target. Chemical composition of the short reduction layer film will be described in further detail in the examples below.

Above short reduction layer 120, an organic electroluminescent medium 130 is formed. There are many different organic electroluminescent media configurations known in the art which can be successfully applied to the present invention by one skilled in the art. Although the organic electroluminescent medium 130 is shown as a single layer, it preferably includes a plurality of sub-layers such as a hole transporting sub-layer and an electron transporting sub-layer. Organic electroluminescent medium 130 can include additional sub-layers such as hole injecting sub-layers and light emitting sub-layers. For example, a basic two-layer electroluminescent medium device structure is described in U.S. Pat. No. 4,356,429. One exemplary configuration of organic electroluminescent medium 130 includes a hole transporting sub-layer including NPB (4,4'-Bis[N—(1-naphthyl)-N-phenylamino]biphenyl) and an electron transporting sub-layer including AlQ (tris(8-hydroxyquinoline) aluminum). Additionally, it is often useful to provide a hole-injecting sub-layer between the anode and the hole transporting sub-layer. The hole-injecting material can serve to facilitate injection of holes into the hole-transporting layer. There are a wide variety of hole injecting materials known in the art including plasma-deposited fluorocarbon polymers as described in U.S. Pat. Nos. 6,127,004; 6,208,075, and 6,208,077. Hexaazatriphenylene derivatives are also useful as hole-injecting materials, as described in U.S. Pat. No. 6,720,573. Particularly useful compounds include hexaazatriphenylene derivatives according to formula K-1 below wherein each R is independently or simultaneously selected from the group consisting of hydrogen atom, C1-C12 hydrocarbon, halogen, alkoxy, arylamine, ester, amide, aromatic hydrocarbon, heterocyclic compound, nitro, and nitrile (—CN) group.

Formula K-1:

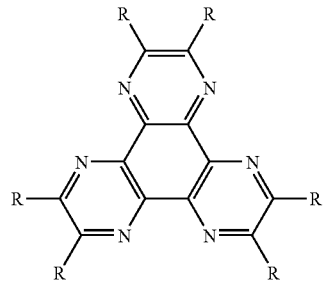

One particularly useful hole-injecting hexaazatriphenylene derivative is hexacyanohexaazatriphenylene (CHATP), shown below as formula K-2:

Formula K-2:

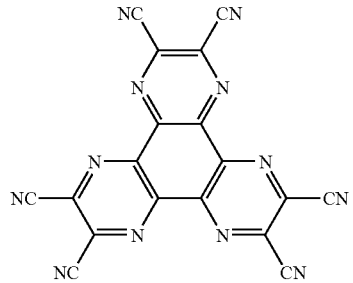

Over organic electroluminescent medium 130, an upper electrode 140 is formed. Although shown as a single layer, upper electrode 140 can also include a plurality of sub-layers. Several upper electrode configurations are known in the art and can be applied to the present invention by one skilled in the art. One particularly preferred configuration for upper electrode 140 includes a sub-layer of Li or LiF approximately 0.5 nm thick in contact with the organic electroluminescent medium 130 for facilitating electron injection followed by a layer of Al approximately 100 to 400 nm thick. Other features such as a moisture barrier encapsulation (not shown) or desiccant (not shown) commonly used in the art of fabricating OLED devices may also be included. Alternately, the OLED device of the present invention may be arranged relative to active matrix circuitry (not shown) including thin film transistor drive elements to form a pixelated display device.

As taught by Tyan et al. in U.S. Pat. No. 7,183,707, the short reduction layer 120 reduces the leakage current through small, localized shorts such as caused by particle contamination by introducing a resistive component in the path of the short between the organic electroluminescent medium and one of the electrodes. It is desirable that the short reduction layer be of high enough resistive to reduce leakage current through the short to less than the current flowing through the function OLED element. However, if the short reduction layer is too resistive, the current flow through the entire OLED device will be impaired, thereby resulting in increased operating voltage. On the other hand, if the resistance of the short reduction layer is too low, lateral current flow will occur in the short reduction layer which can result in cross-talk between neighboring emitting areas.

EXAMPLE 1

A range of thin films for use as short reduction layers in an OLED device were made by co-sputtering an ITO (In$_2$O$_3$:SnO$_2$ 90%:10% by weight) target from a DC Magnetron sputtering source while simultaneously sputtering a ZSO (ZnS:SiO$_2$ 80%:20% by mol) target from an RF Magnetron sputtering source. The sputtering was performed at process pressure of 5 milli-Torr (mTorr) using a gas mixture of Ar:2%O$_2$. The substrates were not actively heated or cooled during the sputtering process. The chemical composition of the films were varied by adjusting the relative powers on the sputter sources. That is, the ITO source power was varied from 30 W to 100 W while the ZnS:SiO$_2$ source power was keep at 80 W. Deposition was performed for a duration suitable to obtain a target thickness of approximately 100 nm. The films were deposited on glass substrates. The resulting films were measured for thickness with a surface profilometer, sheet resistance with a Keithly model 8009 high resistivity test fixture, and chemical composition by X-Ray Photoelectron Spectroscopy (XPS). Thru-film resistivity was then calculated by multiplying sheet resistance by thickness. The results are listed in Table 1.

TABLE 1

| Sample ID | ZSO Power (W) | ITO Power (W) | Thickness (nm) | Sheet Resistance (ohm/sq) | Bulk Resistivity (ohm * cm) | In(at %)/ Zn(at %) Ratio | Sn(at %)/ Zn(at %) Ratio | In(at %)/ S(at %) Ratio | Sn(at %)/ S(at %) Ratio |
|---|---|---|---|---|---|---|---|---|---|
| 1-1 | 80 | 40 | 102.6 | 1.03E+13 | 1.06E+08 | 0.90 | 0.08 | 1.85 | 0.17 |
| 1-2 | 80 | 50 | 119.7 | 2.30E+12 | 2.75E+07 | 1.29 | 0.13 | 1.89 | 0.19 |
| 1-3 | 80 | 60 | 96.8 | 2.57E+11 | 2.49E+06 | 1.50 | 0.15 | 2.41 | 0.25 |
| 1-4 | 80 | 70 | 96.1 | 1.04E+11 | 9.99E+05 | 1.54 | 0.16 | 2.23 | 0.24 |
| 1-5 | 80 | 80 | 107.8 | 2.30E+10 | 2.48E+05 | 1.75 | 0.19 | 2.96 | 0.32 |
| 1-6 | 80 | 90 | 101.0 | 1.20E+10 | 1.21E+05 | 2.37 | 0.25 | 3.00 | 0.32 |

TABLE 1-continued

| Sample ID | ZSO Power (W) | ITO Power (W) | Thickness (nm) | Sheet Resistance (ohm/sq) | Bulk Resistivity (ohm * cm) | In(at %)/ Zn(at %) Ratio | Sn(at %)/ Zn(at %) Ratio | In(at %)/ S(at %) Ratio | Sn(at %)/ S(at %) Ratio |
|---|---|---|---|---|---|---|---|---|---|

From table 1, it can be seen that films having sheet resistance of between approximately $1.2 \times 10^{10}$ and $1 \times 10^{13}$ ohms per square were achieved by increasing the amount of ITO relative to the amount of ZSO. These mixtures corresponded to atomic ratios of In to Zn ranging from 2.37 to 0.90 respectively.

EXAMPLE 2

A series of OLED devices (2-1 to 2-6) were fabricated having the structure shown in FIG. 1. Each OLED device was formed depositing a SRL layer 120 having a co-sputtered mixture of ITO and ZSO approximately 100 nm in thickness, such as described above in EXAMPLE 1. All device were constructed on a substrate 100 made of glass approximately 1.1 mm thick, had an lower electrode 110 of approximately 21 nm thick ITO, an organic electroluminescent medium 130 comprising, in order starting from nearest the lower electrode, a 5 nm thick first sub-layer of CHATP, a 10 nm thick second sub-layer of NPB, and a 15 nm thick third sub-layer of ALQ, and an upper electrode 140 including a first sub-layer of 0.5 nm of LiF followed by a second sub-layer of 100 nm of Al. For comparison, a device (2-C) without any short reduction layer was also constructed as a control. The resulting devices were then measured for drive voltage at a current density of 20 mA/cm2. The sputter power applied to the ZSO and ITO targets for constructing the short reduction layer film as well as the resulting drive voltage and delta voltage relative to control 2-C for each device are shown in Table 2.

TABLE 2

| Sample ID | ZSO Power (W) | ITO Power (W) | Voltage (V) | Delta Voltage (V) |
|---|---|---|---|---|
| 2-1 | 80 | 40 | 5.49 | 1.76 |
| 2-2 | 80 | 50 | 4.31 | 0.57 |
| 2-3 | 80 | 60 | 4.31 | 0.58 |
| 2-4 | 80 | 70 | 4.01 | 0.28 |
| 2-5 | 80 | 80 | 3.82 | 0.09 |
| 2-6 | 80 | 90 | 3.82 | 0.09 |
| 2-C | | | 3.73 | 0.00 |

As can be seen from Table 2, decreasing the amount of ITO in the short reduction layer results in an increase in the resulting voltage of the OLED device. This is due to the increased resistance of the Short reduction layer film and is consistent with the increasing resistivity of the corresponding films shown in Table 1. The increase in voltage compared to the control device (sample 2-C) is shown in "Delta Voltage" column. All the devices were found to produce light emission at reasonable voltages (<10 V), indicating that SRL films made from ratios of ITO:ZSO power densities of as low as 40W:80W are useable. From Table 1, it can be seen that such films have a chemical In to Zn atomic composition of 0.9. However, these devices represent a voltage increase, and therefore a power increase of almost 50%. Voltage increases of less than 1.0 V are more preferred. It is therefore found to be more preferable to keep the ITO:ZSO power density of at least 50W:80W or having In to Zn atomic compositions of greater than 1.29. When measured at low operating current densities of approximately 0.01 mA/cm$^2$ where the effective resistance of the OLED is relatively high, some lateral leakage current through the short reduction layer was observed on sample 2-6 due to its relatively high sheet resistance. As such, it was found to be preferable to keep the ITO:ZSO power density of lower than 80W:80W or having In to Zn atomic compositions of less than 1.75. That is, taking the drive voltage and lateral conduction requirements together, the more preferred range of In to Zn concentration was found to the range of from 1.29 to 1.75. As indicated by the comparable drive voltages achieved, particularly for samples 2-5 and 2-6, the CHATP sub-layer was found to provide good carrier injection from the short reduction layer.

The invention has been described in detail with particular reference to certain preferred embodiments thereof, but it will be understood that variations and modifications can be effected within the spirit and scope of the invention.

PARTS LIST

100 Substrate
110 Lower Electrode
120 Short Reduction Layer
130 Organic Electroluminescent Medium
140 Upper Electrode

The invention claimed is:

1. In an OLED device having:
    (a) a substrate;
    (b) a first electrode layer disposed over the substrate;
    (c) an inorganic short reduction layer disposed over the first electrode layer;
    (d) an organic electroluminescent medium disposed over the short reduction layer; and
    (e) a second electrode layer over the electroluminescent medium, the improvement comprising:
    (f) the short reduction layer including a mixture of ZnS, SiO$_2$, and ITO wherein the ratio of In atoms to Zn atoms is in the range of from 1.29 to 1.75.

2. The OLED device of claim 1 wherein the organic electroluminescent medium includes a hole injecting sub-layer containing a hexaazatriphenylene derivative.

3. A method of making an OLED device including:
    (a) providing a substrate;
    (b) forming a first electrode layer disposed over the substrate;
    (c) sputtering an inorganic short reduction layer so that it is disposed over the first electrode layer, the short reduction layer including a mixture of ZnS, SiO$_2$, and ITO wherein the ratio of In atoms to Zn atoms is in the range of from 1.29 to 1.75;
    (d) forming an organic electroluminescent medium disposed over the short reduction layer; and
    (e) forming a second electrode layer over the electroluminescent medium.

4. The method of claim 3 wherein the mixture is sputtered from a single target.

5. The method of claim 3 wherein the mixture is sputtered from two different targets.

6. The method of claim 5 wherein the one of the two targets is comprises ITO and the other target comprises a mixture of ZnS and $SiO_2$.

7. The method of claim 3 wherein the organic electroluminescent medium includes a hole injecting sub-layer containing a hexaazatriphenytene derivative.

* * * * *